(12) United States Patent
Anderson et al.

(10) Patent No.: US 7,433,790 B2
(45) Date of Patent: Oct. 7, 2008

(54) AUTOMATIC REFERENCE VOLTAGE TRIMMING TECHNIQUE

(75) Inventors: Thomas R. Anderson, Tucson, AZ (US); William Castellano, Syosset, NY (US); Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 7 days.

(21) Appl. No.: 11/145,906

(22) Filed: Jun. 6, 2005

(65) Prior Publication Data
US 2006/0276986 A1    Dec. 7, 2006

(51) Int. Cl.
*G01D 21/00*    (2006.01)
(52) U.S. Cl. .............................. 702/85; 702/99; 374/171
(58) Field of Classification Search ................ 702/64, 702/65, 85, 99, 107, 130; 323/313–316; 341/139, 140; 374/171
See application file for complete search history.

(56) References Cited

U.S. PATENT DOCUMENTS

| | | | | |
|---|---|---|---|---|
| 4,246,641 A * | 1/1981 | Babil et al. | .................... | 702/99 |
| 5,038,094 A | 8/1991 | Rashid | ......................... | 322/28 |
| 5,055,902 A | 10/1991 | Lambert | ..................... | 257/272 |
| 5,325,045 A | 6/1994 | Sundby | ....................... | 323/313 |
| 5,432,475 A | 7/1995 | Fukahori | .................... | 330/254 |
| 5,504,470 A | 4/1996 | Ginn | ........................... | 338/20 |
| 5,550,512 A | 8/1996 | Fukahori | .................... | 330/254 |
| 5,982,163 A | 11/1999 | Shinozaki | ................... | 323/354 |
| 6,194,962 B1 | 2/2001 | Chen | ............................. | 330/9 |
| 6,218,822 B1 | 4/2001 | MacQuigg | .................. | 323/313 |
| 6,285,258 B1 | 9/2001 | Ikeuchi et al. | ................ | 330/288 |
| 6,329,804 B1 | 12/2001 | Mercer | ........................ | 323/315 |
| 6,424,211 B1 | 7/2002 | Nolan et al. | .................... | 330/2 |
| 6,605,979 B1 | 8/2003 | Archer | ........................ | 327/525 |
| 6,614,305 B1 | 9/2003 | Ivanov et al. | ................ | 330/256 |
| 6,642,779 B2 | 11/2003 | Easwaran et al. | ........... | 327/553 |
| 6,750,641 B1 | 6/2004 | Ivanov et al. | ................ | 323/315 |
| 6,785,163 B2 | 8/2004 | Yeh et al. | .................. | 365/185.2 |
| 7,023,194 B1 * | 4/2006 | Sutardja et al. | ............. | 323/314 |
| 2001/0007091 A1 * | 7/2001 | Walter et al. | ................. | 702/107 |
| 2003/0063500 A1 * | 4/2003 | Naso et al. | ................... | 365/200 |
| 2003/0164697 A1 * | 9/2003 | Hardie | .................. | 324/207.15 |
| 2004/0222812 A1 * | 11/2004 | Frankowsky et al. | ......... | 324/763 |
| 2006/0093016 A1 * | 5/2006 | McLeod et al. | ............. | 374/178 |
| 2006/0274594 A1 * | 12/2006 | Huckaby et al. | ............ | 365/226 |

\* cited by examiner

*Primary Examiner*—Manuel L Barbee
(74) *Attorney, Agent, or Firm*—Meyertons Hood Kivlin Kowert & Goetzel, P.C.; Jeffrey C. Hood

(57) ABSTRACT

In one set of embodiments, trimming of a reference, which may be a bandgap reference and which is configured on an integrated circuit, may be controlled by an algorithm executed by logic circuitry also configured on the integrated circuit. The bandgap reference may be configured to generate a reference voltage provided to an analog to digital converter (ADC) comprised in a temperature sensor that may also be configured on the integrated circuit. The logic circuitry may be configured to execute one or more of a variety of test algorithms, for example a Successive Approximation Method or remainder processing, that are operable to adjust values of reference trim bits used in trimming the bandgap reference. A tester system configured to perform testing of the integrated circuit may initiate execution of the test algorithm, thereby initiating the trimming process, and may wait for the test algorithm to complete within a previously defined amount of time, or may poll the logic circuitry to determine when the trimming process is complete.

38 Claims, 9 Drawing Sheets

AUTOMATIC REFERENCE VOLTAGE TRIMMING TECHNIQUE

BACKGROUND OF THE INVENTION

1. Field of the Invention

This invention relates generally to the field of analog integrated circuit design and, more particularly, to the design of reference voltage control circuits.

2. Description of the Related Art

In the design of many integrated circuits, more specifically those using complementary metal-oxide-semiconductor (CMOS) technology, a specified and stable reference value, for example a reference voltage, may often be required to insure proper circuit operation. When designing analog circuits or circuit with analog components, a specified and stable reference voltage may be a necessity for the circuit to properly function in a substantially predictable manner. Examples of such circuits include devices that monitor temperature and voltage. Temperature monitoring devices are often included as part of digital systems, especially systems that include high-performance, high-speed circuits prone to operational variances due to temperature effects, in order to maintain the integrity of the system components.

Personal computers (PC), signal processors and high-speed graphics adapters, among others, typically benefit from temperature monitoring circuits. For example, a central processor unit (CPU) that typically "runs hot" as its operating temperature reaches high levels may require a temperature sensor in the PC to insure that it doesn't malfunction or break due to thermal problems. Typically, integrated circuit (IC) solutions designed to measure temperature in a system will monitor the voltage across one or more PN-junctions, for example a diode or multiple diodes at different current densities to extract a temperature value. This method generally involves sampling voltages generated on the diode(s), some analog processing of the sampled voltages, and conversion by an analog-to-digital converter (ADC). ADCs generally require a precise voltage reference to function accurately and reliably.

Most of the time, reference values—voltage reference values in case of ADCs—need to be adjusted to account for possible process variations. When working within generally tight operational tolerances, a trim capability of the circuit may be required to make the necessary adjustments needed for achieving proper circuit operation over variations present in silicon processing. This trim capability for adjusting the reference voltage is commonly implemented by way of fuses that are usually cut or uncut, and/or by programming a one time programmable dedicated memory such as a ROM. Oftentimes the trimming process includes probing wafers during device characterization, determining the required trim, then cutting the fuses using laser trimming-devices or programming the dedicated ROM. The amount of trim may be determined based on a set of 'trim bits' indicating which fuses to cut and which fuses to leave uncut and/or which memory bits to set in the dedicated ROM.

When a device is being trimmed and/or adjusted, the test system controlling the trim operation typically has to set the device, make a measurement, make a decision based on the measurement, set the device based on the decision, and repeat the measurement. This measure-decide-set loop is typically repeated under control of the test system until the adjustment is completed. Such a process tends to consume a considerable amount of time due to the interaction of the device and test system, and the constant intervention required by the test system. In addition, any trimming algorithm built into the test software devised to perform such a process would have to track the settings that have been made, and determine what the next setting should be, in addition to keeping track of other possible parameters. This may place certain requirements on the capabilities of the tester that may not be available in some low cost test systems. It may also make it difficult, if at all possible, to considerably reduce testing costs, by preventing the system to make use of time- and cost-saving testing methods such as testing multiple devices in parallel during multi-site testing.

Other corresponding issues related to the prior art will become apparent to one skilled in the art after comparing such prior art with the present invention as described herein.

SUMMARY OF THE INVENTION

In one set of embodiments, the invention comprises a system and method for performing auto-trimming of a voltage reference comprised on an integrated circuit (IC). The trimming of the reference, which may be a bandgap reference, may be controlled by an algorithm executed by logic circuitry also configured on the IC. The bandgap reference may be configured to generate a reference voltage provided to an analog to digital converter (ADC) comprised in a temperature sensor that may also be configured on the integrated circuit. The logic circuitry may be configured to execute one or more of a variety of test algorithms, for example a Successive Approximation Method or Remainder Method, that are operable to adjust values of reference trim bits used in trimming the bandgap reference. Alternate embodiments may include different algorithms, which may be used to control the automatic trimming process. A tester system configured to perform testing of the integrated circuit may initiate execution of the test algorithm, thereby initiating the trimming process, and may wait for the test algorithm to complete within a previously defined amount of time, or may poll the logic circuitry to determine when the trimming process is complete. This may free the tester from controlling the trim operation.

In one set of embodiments, the auto-trim function may be used after first setting the IC device in a test mode that would be used for manual or tester controlled trimming. A stimulus may be applied, such as a voltage or diode at a known temperature (in the case of a temperature sensor), such that a known digital output that is the ideal output of the voltage or temperature converter may be expected at the digital output.

One trim algorithm that may be executed by logic configured on the IC is a Successive Approximation Method. In this method, the adjustment of trim bits may be started by setting the most significant bit (MSB) to '1', which may constitute the center of the adjustment range. If the measurement is too high, the MSB may be turned off. If the measurement is too low, the MSB may remain turned off. This comparison may be implemented in digital logic. In cases where the IC device under test may already have circuitry for comparing the output of the converter against a programmable limit, reuse of this circuitry for the trim algorithm may be the preferred embodiment as this approach might reduce the required die area. After the initial decision for the MSB, the next bit may be set and the digital output may again be tested against the target value. If the output is too high, again the bit may be turned off, or if the output is too low, the bit may remain turned on. The algorithm may proceed through each bit in turn until all bits have been tested and turned on or off. For N bits, there may be a decision tree with N decision levels that can branch to any or $2^N$ solutions.

In an alternate embodiment, the logic configured on the IC may be operable to execute a Remainder Method. Again the IC device is configured in a test mode and a stimulus may be applied, such as a voltage or diode at a known temperature (in the case of a temperature sensor), such that a known digital output that is the ideal output of the voltage or temperature converter may be expected at the digital output. According to this algorithm, an initial comparison of the ADC digital output may be made against the ideal value, with the trim bits set to their nominal value. The comparison may yield a difference value, or remainder, being the difference between the ideal value and the nominal value. This remainder may then be transformed into the bit setting that corrects the error by on chip circuitry. In one embodiment, the bit weights may be set by the analog circuit design such that the remainder may be latched directly in to the trim bit settings in order for the trim circuitry to correct the error. For example, if the remainder is 01010, the trim network may be designed such that setting the trim bits to 01010 would yield a measured value equal to the ideal value within the desired acceptable error band.

Alternately, simple logic operations may be performed on the remainder such that the result of the logic operations is the value latched into the trim bits. For example, the difference value may need to be changed to a two's complement number. These logic operations may be required to allow proper design of the trim network in situations where direct mapping of the remainder to the trim bits may be impractical. Furthermore, during the logic operations, the trim bit setting used to correct the error may be selected so as to take into account both the value of the remainder and the bit setting that produced the remainder. In this way, the logic operations may be repeated, that is, another comparison of the actual value may be made against the ideal value after all the trim bits have been set, and the remainder may again be calculated as the difference value resulting from the comparison. The new remainder may then be used, along with the bit setting that created the remainder, to calculate a new, more accurate, setting of the trim bits.

Various algorithms may thus be implemented with on-chip logic circuits that free the tester from having to control the trim algorithm, with all the attendant benefits. In some embodiments, the resulting time and cost for trimming may be lower for the Remainder Method than for a Successive Approximation Method using one comparison per bit.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
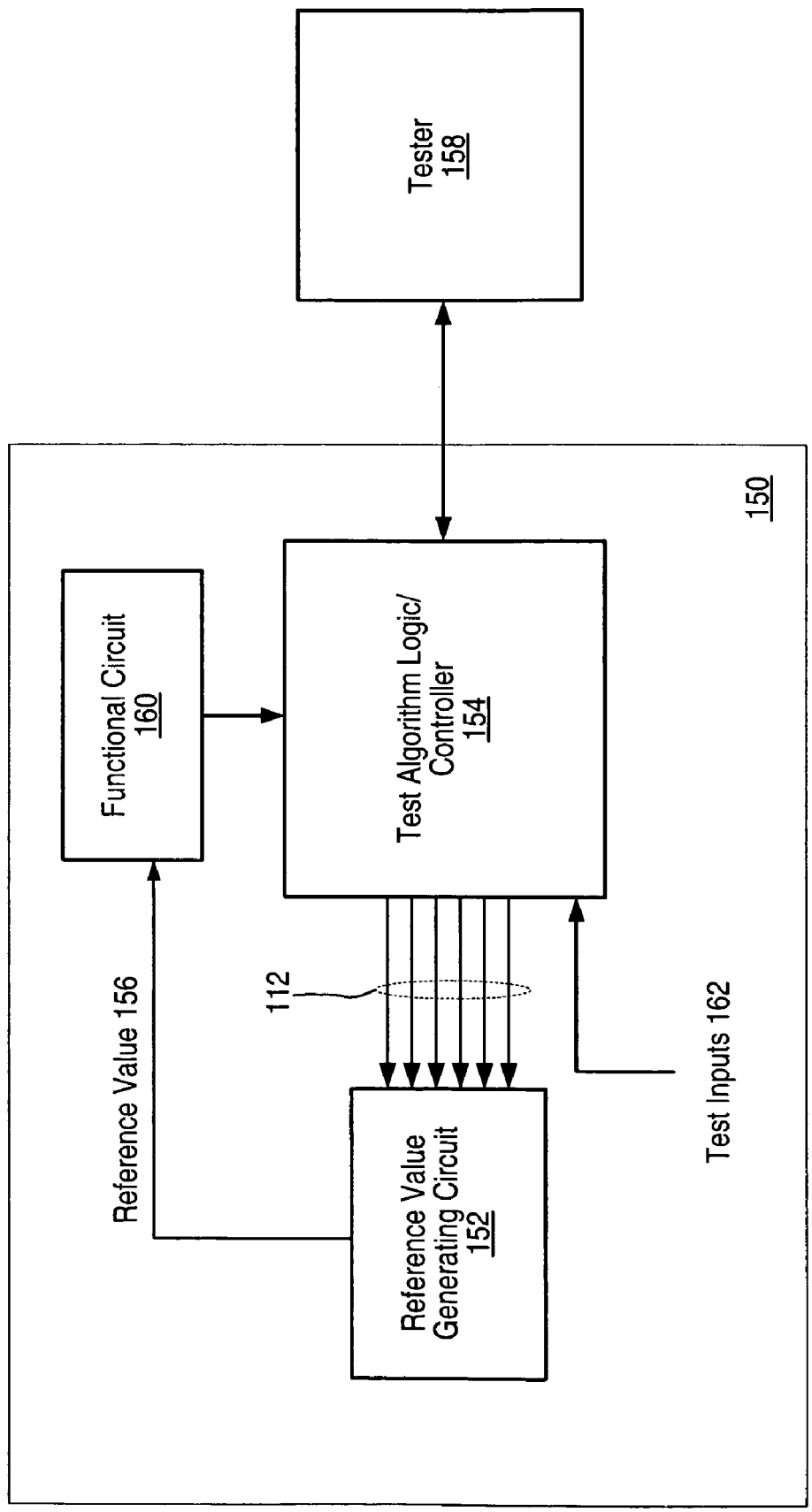
FIG. 1 illustrates an integrated circuit in which logic circuitry is configured to perform a test algorithm to control trimming of a reference value generating circuit also configured on the integrated circuit, according to one set of embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

FIG. 1 shows one embodiment of an integrated circuit (IC) 150 in which a controller/logic block (LBC) 154 is configured to perform a test algorithm to control trimming of a reference value generating circuit (RGC) 152 in order to obtain a specific reference value 156. Reference value 156 may be used by functional circuit (FC) 160, which is also comprised on IC 150. LBC 154 may be configured to receive one or more test inputs 162 and one or more control signals from FC 160. LBC 154 may also be configured to communicate with a tester apparatus 158, which may initiate execution of the test algorithm by LBC 154 and may poll LBC 154 to ascertain whether trimming has been completed. Alternately, LBC 154 may be designed to provide a signal to tester apparatus 158 a specified time period after testing had been initiated, indicating that the trimming is complete. In one embodiment, RGC 152 is bandgap reference and reference value 156 is a reference voltage, while FC 160 is an ADC operating according to the reference voltage. The ADC may be part of a temperature measurement system comprised on IC 150, and trimming the bandgap reference may be performed with the goal of calibrating the temperature measurement system.

Figure 2A:
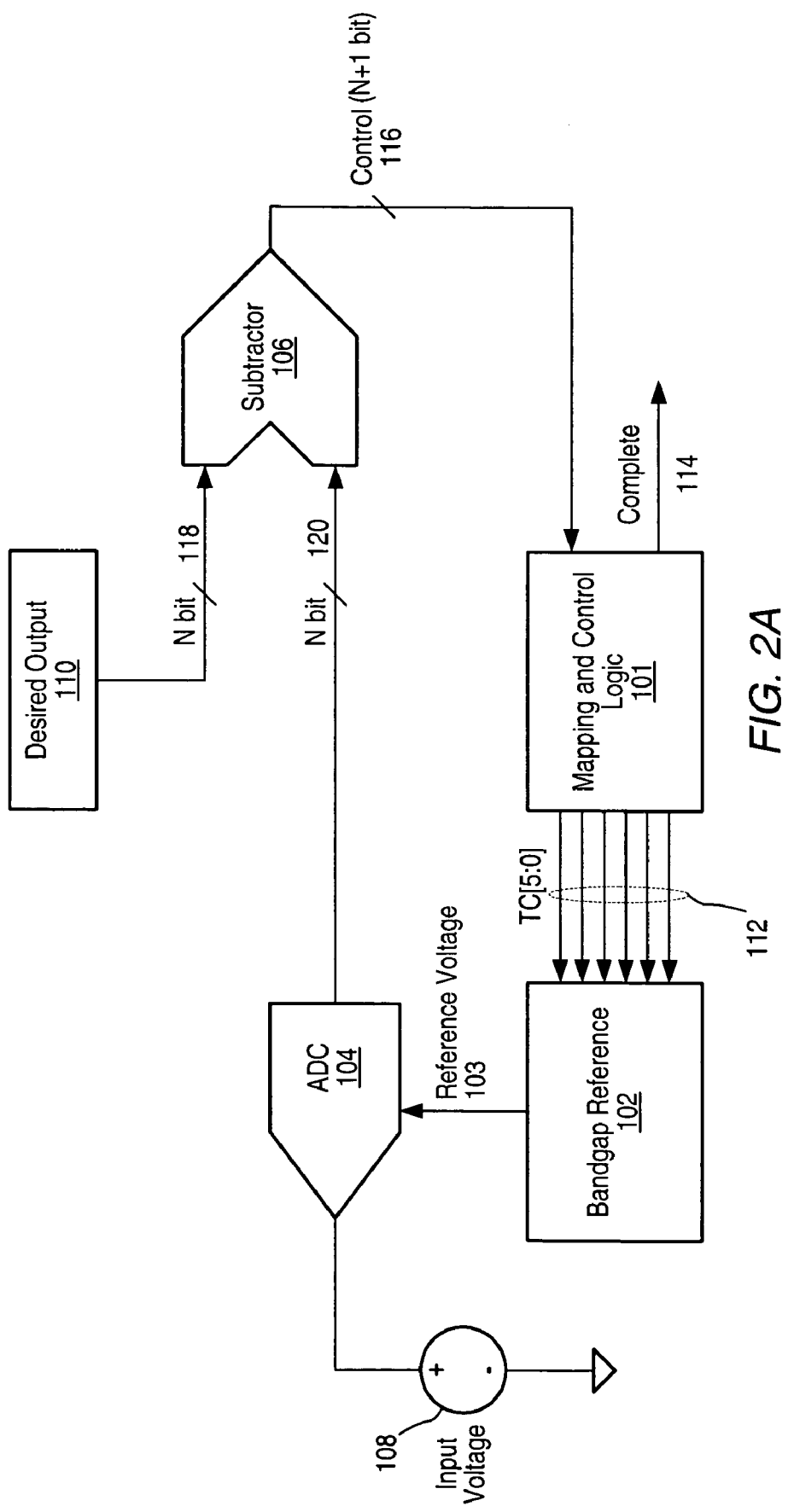
FIG. 2A illustrates in more detail a first embodiment of the integrated circuit of FIG. 1.

In one set of embodiments, LBC 154 may be configured to implement a Remainder Method for calibrating a precision temperature sensor, which may also be configured on IC 150. FIG. 2A shows one embodiment of IC 150 containing an ADC 104 and a bandgap reference 102 providing a reference voltage for ADC 104, whereupon bandgap reference 102 may be auto-calibrated based on the magnitude of the remainder from a subtraction of two digital values. One value may be the result of a temperature conversion, shown as signal 120 in FIG. 2A, while the other value may be the target value for the temperature conversion, shown as signal 118 in FIG. 2A. Signal 118 may be an ideal output code generated by desired output circuitry 110 configured to provide an N-bit numeric value corresponding to a temperature measurement obtained using an ideal bandgap reference.

The conversion may take place on any input channel provided that the ideal output code 118 for a conversion on the particular input channel is known. Ideally, the input for this input channel may be fixed per a reference circuit or diode, in this case desired output 110, at a very stable temperature for the duration of the calibration. In one embodiment, bandgap reference 102 is trimmed using trim bits TC[5:0] 112, which may used to cut and/or leave uncut fuses, and/or program a one time programmable memory, for example a ROM.

In one embodiment, the calibration method includes adjusting the value of reference TC trim bits 112 until reference voltage 103 is at the desired value, which is determined by subtractor 106 producing a zero difference between reference voltage 103 and ideal output code 118. Subtractor 106 may be configured to provide the difference as a control signal 116 to mapping and control logic (MCL) 101, which may be configured to adjust trim TC bits 112 accordingly. In all, MCL 101 configured on IC 150 may be used to adjust TC trim bits 112 until the calibration is sufficiently accurate.

ADC 104 may be a separate part of the calibration method, or it may be a part of the temperature measurement system being calibrated. The calibration may be performed using any ADC as long as the resolution of the ADC is known (i.e. 10 bit, 11 bit etc). For the best accuracy, ADC 104 may preferably be chosen to be monotonic and linear throughout its range. As shown in FIG. 2A, ADC 104 may be used to convert a known input voltage 108 to an output code 120. Output code 120 may then be compared against ideal output code 118, which may represent an output code that an ideal ADC driven by an ideal reference might provide. While the embodiment described herein refers to a specific ADC architecture and control methodology, other embodiments are not limited to that specific architecture, and alternate embodiments with other ADC architectures are possible and are contemplated.

Bandgap reference 102 may be implemented in a variety of ways. However, bandgap reference 102 should preferably be trimmable, that is, be subject to calibration, such that trimming directly affects output reference voltage 103 in a noticeably substantial way. In preferred embodiments, bandgap reference 102 may have a reference voltage output 103 that is properly adjusted for a zero temperature coefficient when reference voltage 103 is at the desired value for an accurate gain of ADC 104. The adjustment may be made using trim bits 112 as previously mentioned. MCL 101 may be configured to monitor control output 116 of subtractor 106 and determine based on control output 116 what the trim configuration for bandgap reference 102 should be, setting trim bits 112 accordingly.

As shown in FIG. 2A, subtractor 106 may take the output of ADC 104 and compare it against the 'desired' output code 118. In one embodiment, subtractor 106 performs two functions between two 'n' bit long data words. The first function may be a '−' (subtraction) comparison, and the second function may be an '=' (equality) comparison. The output of subtractor 106, i.e. control signal 116, may represent the difference between the values of signals 118 and 120. In one embodiment, the trimming is terminated when the difference is less than one least significant bit (LSB), by having MCL 101 configured to end the calibration for such occurrence. In other embodiments MCL 101 may be configured to end trimming for a difference that is greater or less.

In one embodiment, desired output circuitry 110 is implemented with formal addressed registers used to hold the most significant bit (MSB) and LSB bytes of desired output code 118. The trimming process may be initiated at any time, however in preferred embodiments the trimming process may be initiated immediately following power-on-reset (POR).

A specified set of conditions may be established prior to starting the trimming process. Bandgap reference 102 may first be started and allowed to settle, thereby having entered a designated functional mode, in order to avoid a change in reference voltage 103 during conversion, as any such change may result in MLC 101 operating to trim bandgap reference 102 to an incorrect value. All other trim inputs to bandgap reference 102 may be fixed to a known, preferably final state. ADC 104 may also be powered up and allowed to enter a designated functional mode. Input selection of ADC 104 may be fixed at the specific input channel that holds known input voltage 108, which is the channel shown in FIG. 2A. Therefore, in embodiments configured with round-robin circuitry that automatically selects the input channel for ADC 104 for example, the round robin circuitry may be disabled or bypassed. Any trim inputs to ADC 104 may also be fixed to a known, preferably final state.

Figure 3:
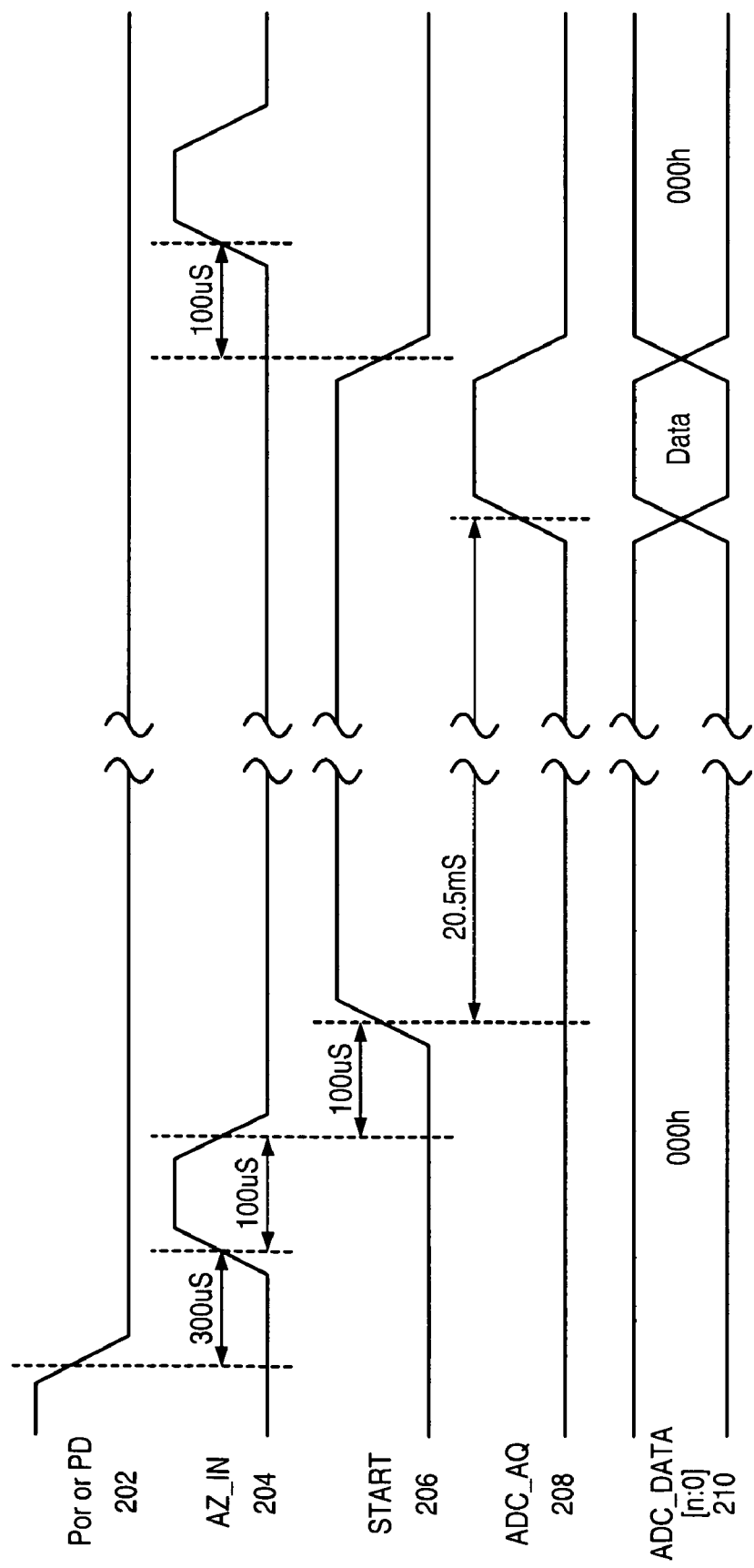
FIG. 3 shows a timing diagram illustrating the control of the ADC and bandgap reference, according to one embodiment.

MCL 101 may be configured to perform timing control of ADC 104, bandgap reference 102, and the state of trim bits 112. FIG. 3 shows a timing diagram illustrating one embodiment of the control timing performed by MCL 101. POR or PD (power down) signal 202 indicates that IC 150 has been powered up/down. AZ_IN signal 204 initiates the auto zeroing functionality of bandgap reference 102. Asserting START signal 206 leads to ADC 104 performing a conversion. As shown, ADC_AQ signal 208 may go high whenever ADC 104 has completed the conversion, signifying that output 120 has been updated and may be sampled by subtractor 106. When ADC_AQ 208 goes high, subtractor 106 may sample output 120, perform the comparison with ideal output code 118, and update control output 116 accordingly. In the timing diagram of FIG. 3, output signal 120 is represented by ADC_DATA [N:0] signal 210.

Once subtractor 106 has sampled output 120, AZ_IN 204 may again be asserted to initiate a next conversion by ADC 104. A clock signal may be used to synchronize the sampling of output 120 and the distribution output 116 from subtractor 106. At least a portion of control output 116 may be equal to the difference of the inputs to subtractor 106, that is, the difference between outputs 118 and 120. An additional portion of control output 116 may be a control bit that is asserted when signals 118 and 120 are equal to each other. This control bit may indicate to MCL 101 that at this point adjusting the values of trim bits 112 may be optional. Control output 116 may be set no later than two clock cycles following ADC_AQ 208 going high, and may remain set for at least one clock cycle.

In one set of embodiments, MCL 101 may comprise an internal counter that may count the number conversions ADC 104 has completed. The internal counter may be decremented within 2 clock cycles of setting each previous trim bit 112. Completion of the trimming process may be determined in a variety of ways. In a preferred embodiment, the trimming process is complete either following subtractor 106 having performed a specified number (for example, three) of comparisons, or when subtractor 106 indicates that signal 118 is equal to signal 120. Trim bits 112 may then be latched and MCL 101 may assert complete signal 114 to indicate that trim bits 112 have been optimally programmed. Complete signal 114 may be received by a tester, such as tester 158 in FIG. 1, which may be operated to perform testing and characterization of IC 150, to confirm that the trimming for IC 150 is complete.

Figure 4A:
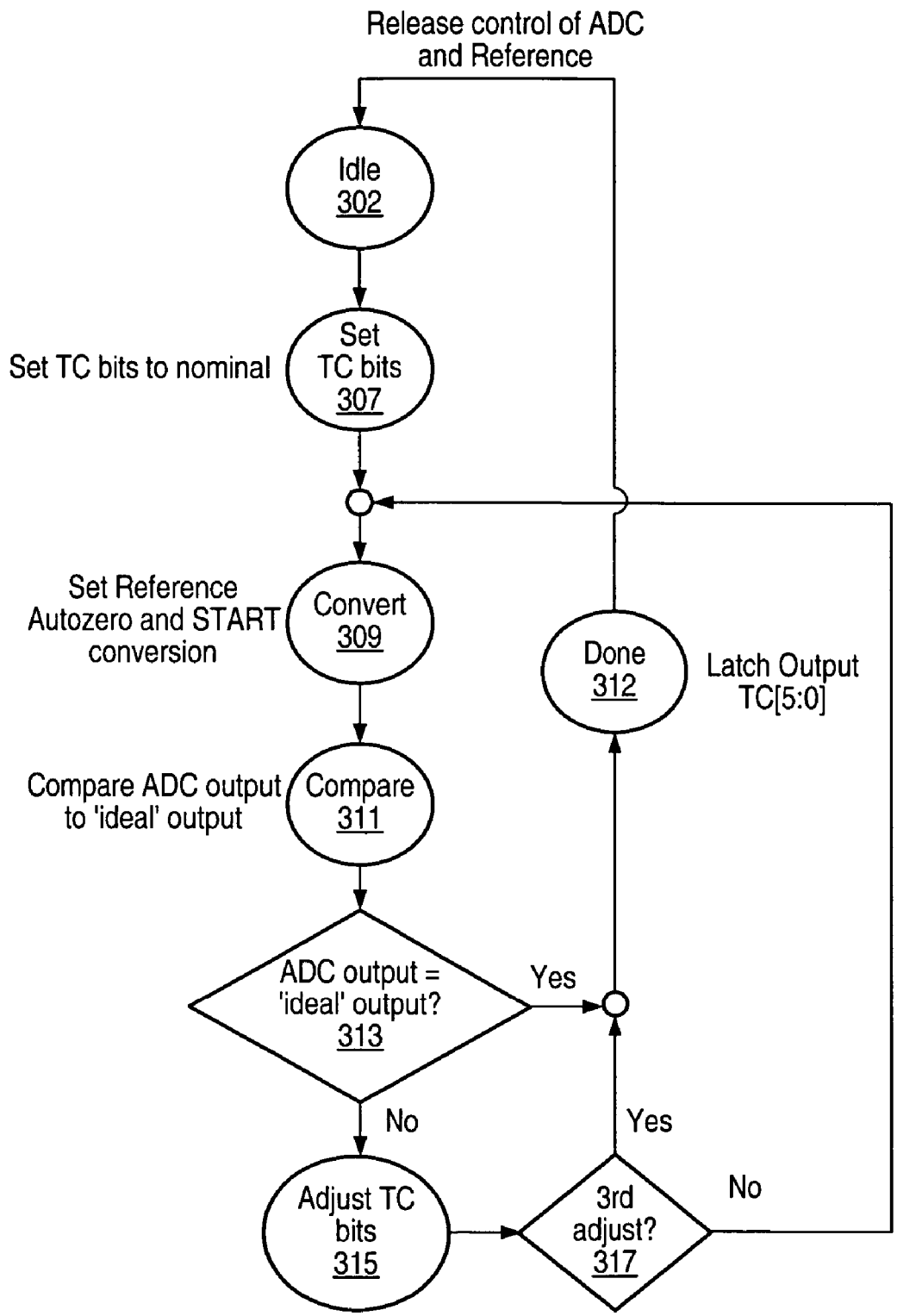
FIG. 4A illustrates the trimming method for the embodiment of FIG. 2A.

FIG. 4a illustrates a flow diagram of one embodiment of the trimming method using the remainder technique previously described. In this embodiment, an idle state (302) represents releasing control of the ADC and the bandgap reference with no trimming being presently performed. Upon start of the trimming process, the trim bits may be set to a nominal value, which may have been previously specified, (307). The bandgap reference autozero may then be set and the ADC may be operated to start a conversion (309). Following the conversion, a comparison between the ADC output and an ideal output may be performed (311), and depending on the results (313), the trim bits may be adjusted accordingly (315) or the trimming process may be terminated (312). If the trim bits have been adjusted (315), and the adjustment represents the final adjustment of a specified number (or sequence) of adjustments (317), then the trimming process may be terminated (312), otherwise the sequence may repeat from starting a new ADC conversion (309).

Figure 2B:
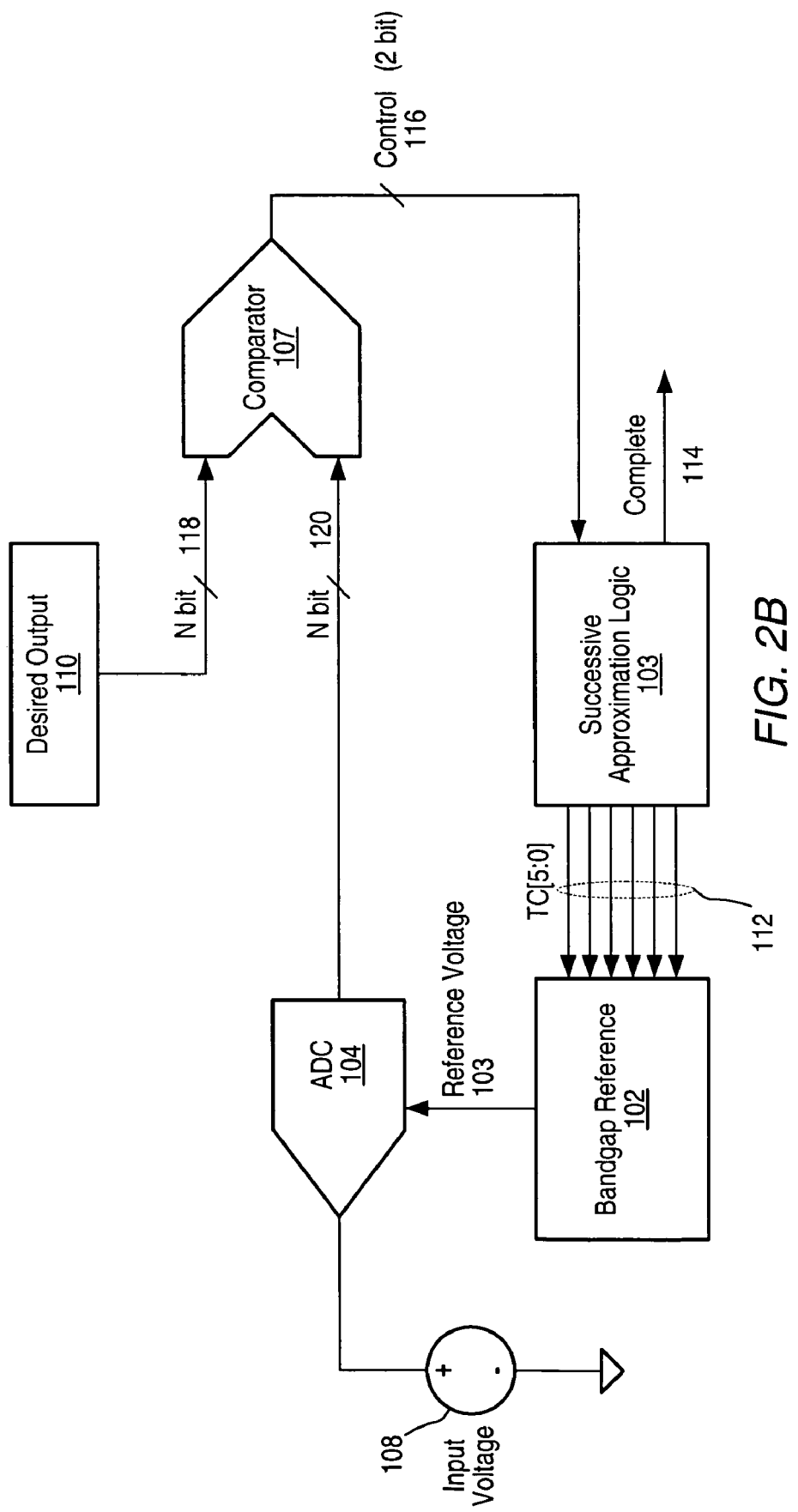
FIG. 2B illustrates in more detail a second embodiment of the integrated circuit of FIG. 1.

FIG. 2B illustrates an alternate embodiment of IC 150, in which subtractor 106 has been replaced with a comparator 107, and in lieu of MCL 101 a successive approximation logic (SAL) block 103 has been configured, for executing a Successive Approximation Method of performing the trimming process. As shown in FIG. 2B, the signal configuration of this embodiment may be realized in a manner substantially identical to the signal configuration found in the embodiment of FIG. 2A. In one embodiment, the Successive Approximation Method comprises an algorithm by which the bandgap reference 102 may be calibrated, or trimmed via multiple conversions. Similar to the previously described Remainder Method, the conversions may be performed by ADC 104 based on any of its input channels, provided that an ideal output code 118 for a conversion on the particular channel is known. Again, ADC 104 may be comprised in a temperature measurement system also configured on IC 150 and subject to calibration via the trimming process. Thus, input voltage 108 would remain fixed as per a reference voltage or very stable temperature for the duration of the calibration. Changes in this voltage during the calibration may result in potential error.

SAL 103 may be configured to monitor comparator control output 117 and determine what the trim configuration for bandgap reference 102 should be. Comparator 107 may take output signal 120 of ADC 104 and compares it against the 'ideal' code output signal 118. If signal 120 is less than output code 118, comparator 107 may assert at least a portion of control signal 117 (which may correspond to a value of '1'), otherwise, it may de-assert the same portion of control signal 117 (which may correspond to a value of '0'). However, if signal 120 has a value matching the value of output code 118, comparator 107 may end the trimming process, and thus the calibration. In one embodiment, comparator 107 performs two functions between two 'n' bit long data words, a first function of a "less than" ('<') comparison, and a second function of an "equal" ('=') comparison.

In one embodiment, SAL 103 is configured to control the timing to the auto-zero input of bandgap reference 102 and the timing of a start signal to ADC 104, in addition to determining how to reprogram TC trim bits 112 according to control output 117. Timing control for starting the trimming process may be performed similarly to the timing illustrated in FIG. 3, using the signals also shown in FIG. 3. Thus, every time ADC_AQ signal 208 is asserted, SAL 103 may wait two clock cycles for control output 117 of comparator 107, and may at that point determine the next TC trim bit 112 to set. SAL 103 may be operated to initially set the TC[5] bit to a '1' and the others to a '0', and perform an ADC conversion. It should be noted that while the embodiment shown illustrates six TC trim bits in trim bits 112, alternate embodiments may be configured with less or more trim bits, with the additional (or decreased number of) trim bits all adjusted according to the principles set forth herein.

Figure 4B:
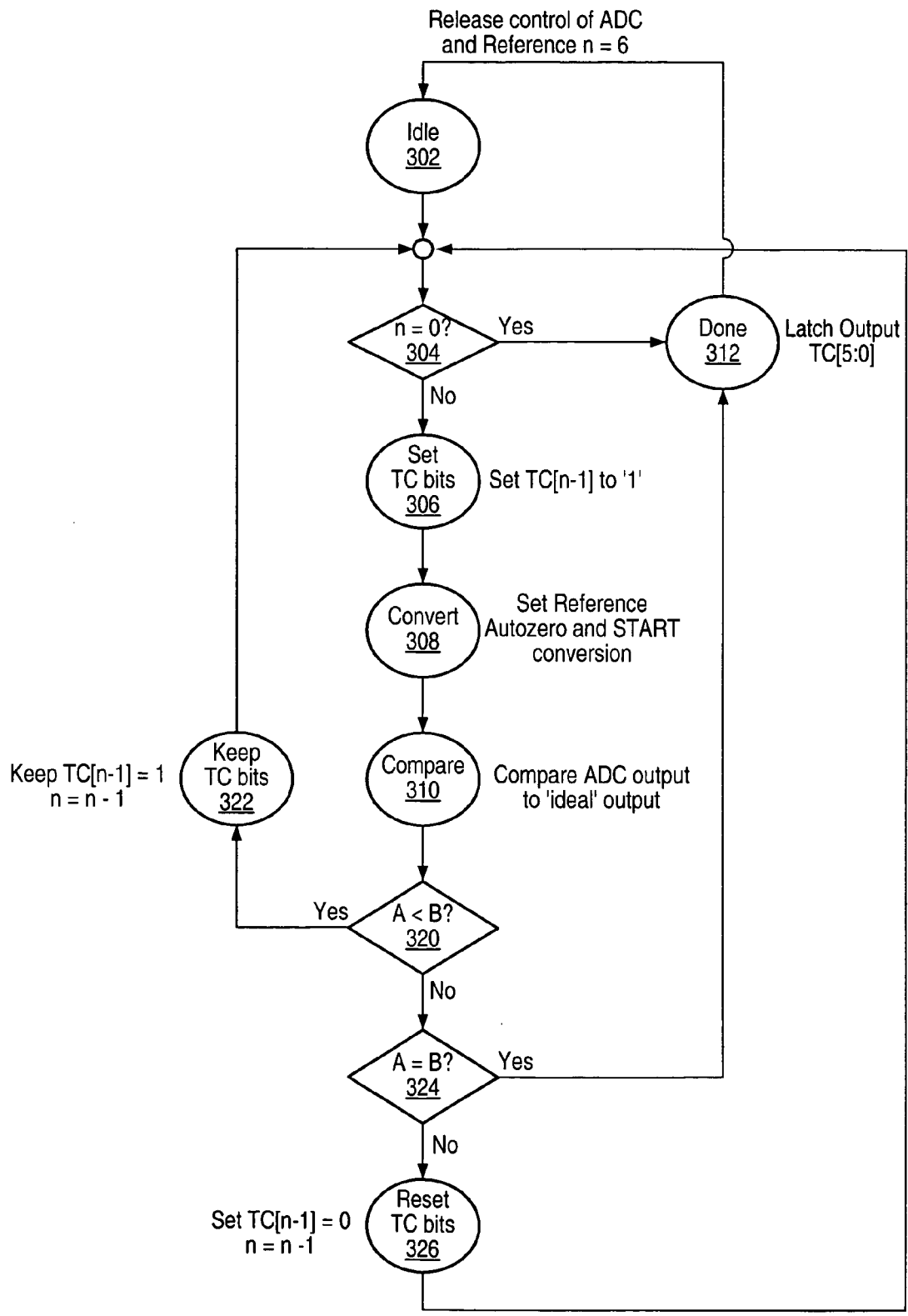
FIG. 4B illustrates the trimming method for the embodiment of FIG. 2B.

FIG. 4B illustrates a flow diagram of one embodiment of the trimming method using the Successive Approximation Method. Idle state (302) may represent releasing control of the ADC and the bandgap reference with no trimming being presently performed, and setting the value of the trim bit index to a value equivalent to the number of trim bits being used (in this embodiment, a value of '6'). Checking the current value of the trim bit index (304) may lead to completing the trimming process (312) if the index value is '0', otherwise the trimming process may proceed. The trim bit corresponding to the current index value minus one may be set to '1' (306), bandgap reference autozero may be set, and the ADC may be operated to start a conversion (308). While in this embodiment setting a trim bit comprises setting the bit to '1', in alternate embodiments setting the bit may comprise setting the bit to '0'. The output of the ADC may then be compared to the ideal output (310).

Starting with the highest trim bit index (in this case 6-1, or 5), if the output of the comparator indicates that the ADC output data is lower than the ideal output data (320), then trim bit TC[5] may remain at its current set value and the trim bit index may be decreased by '1' (322). Subsequently, the trim bit index value may again be checked (304), and if it is not found to be '0' then the trim bit corresponding to the current trim bit index, now TC[4], may be set to '1', and a next conversion may be initiated (308). Conversely, if the output of the comparator indicates that the ADC output is higher than the ideal output data (320 followed by 324), trim bit TC[5] may be reset to a '0' and the trim bit index may be decreased by '1' (326). Subsequently, the trim bit index value may again be checked (304), and if it is not found to be '0' then the trim bit corresponding to the current trim bit index, now TC[4], may be set to '1', and a next conversion may be initiated (308). This sequence may be performed until all trim bits have been set (304 indicates that the trim bit index is '0') or the comparator indicates that the ADC output is equal to the ideal output (324 indicates A=B).

Figure 5:
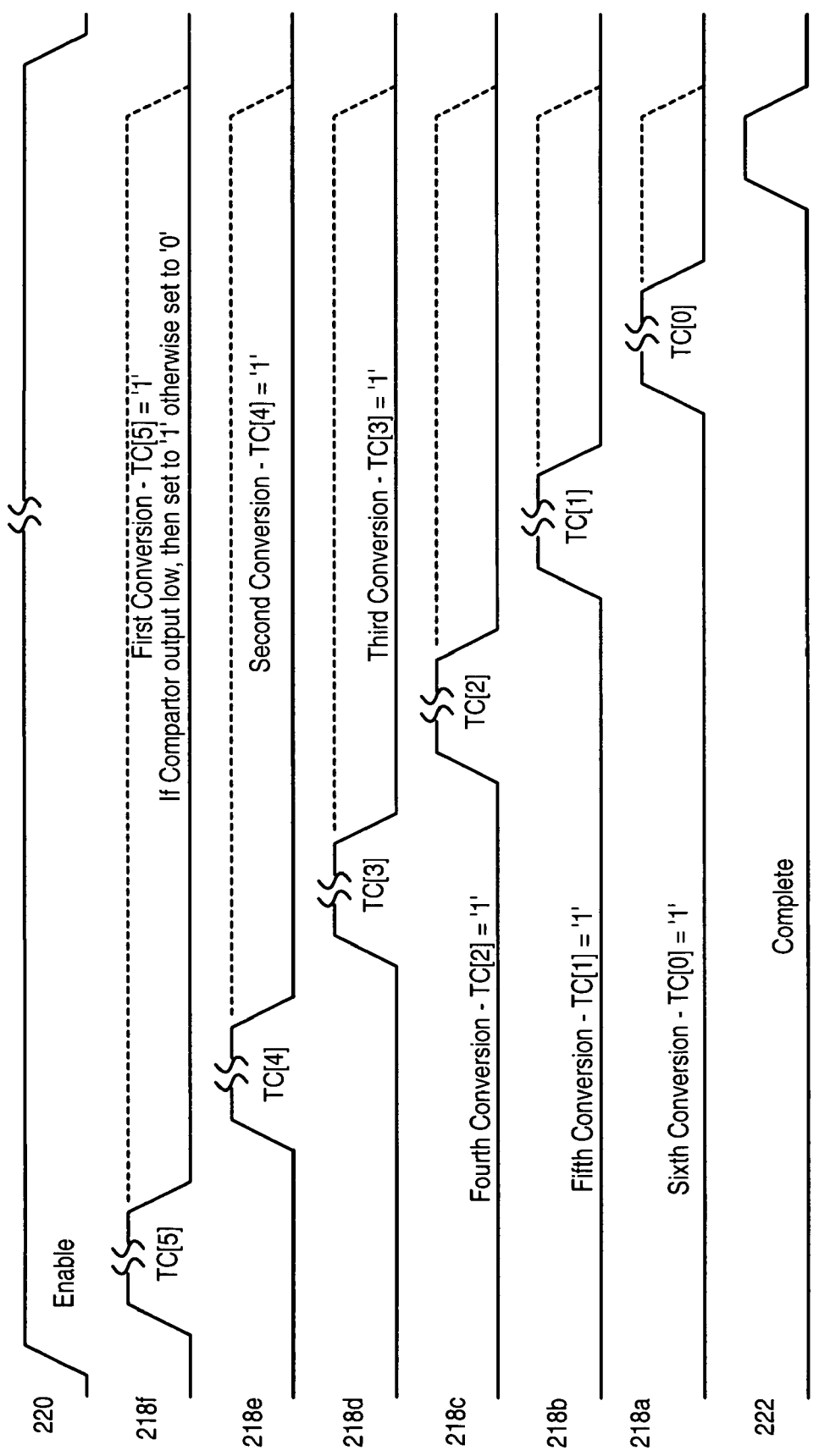
FIG. 5 show a timing diagram illustrating the setting of the trim bits according to one embodiment.

Referring again to FIG. 2B, SAL 103 may comprise an internal counter that may count the number of ADC conversions that have been completed, decrementing the count within two clock cycles of setting the previous trim bit. Upon completing the trimming process as described above, trim bits 112 may be latched and SAL 103 may assert complete signal 114 to indicate (possibly to a coupled tester such as the one in FIG. 1) that the trim bits have been optimally programmed. Timing of the flow described in FIG. 4B is illustrated in the timing diagram of FIG. 5. Upon enabling the trimming process (signal 220 being asserted), signals 218f-218a show trim bits 5-0 being set, respectively, until complete signal 222, which may be equivalent to complete signal 114 in FIG. 2B, is set.

Figure 6:
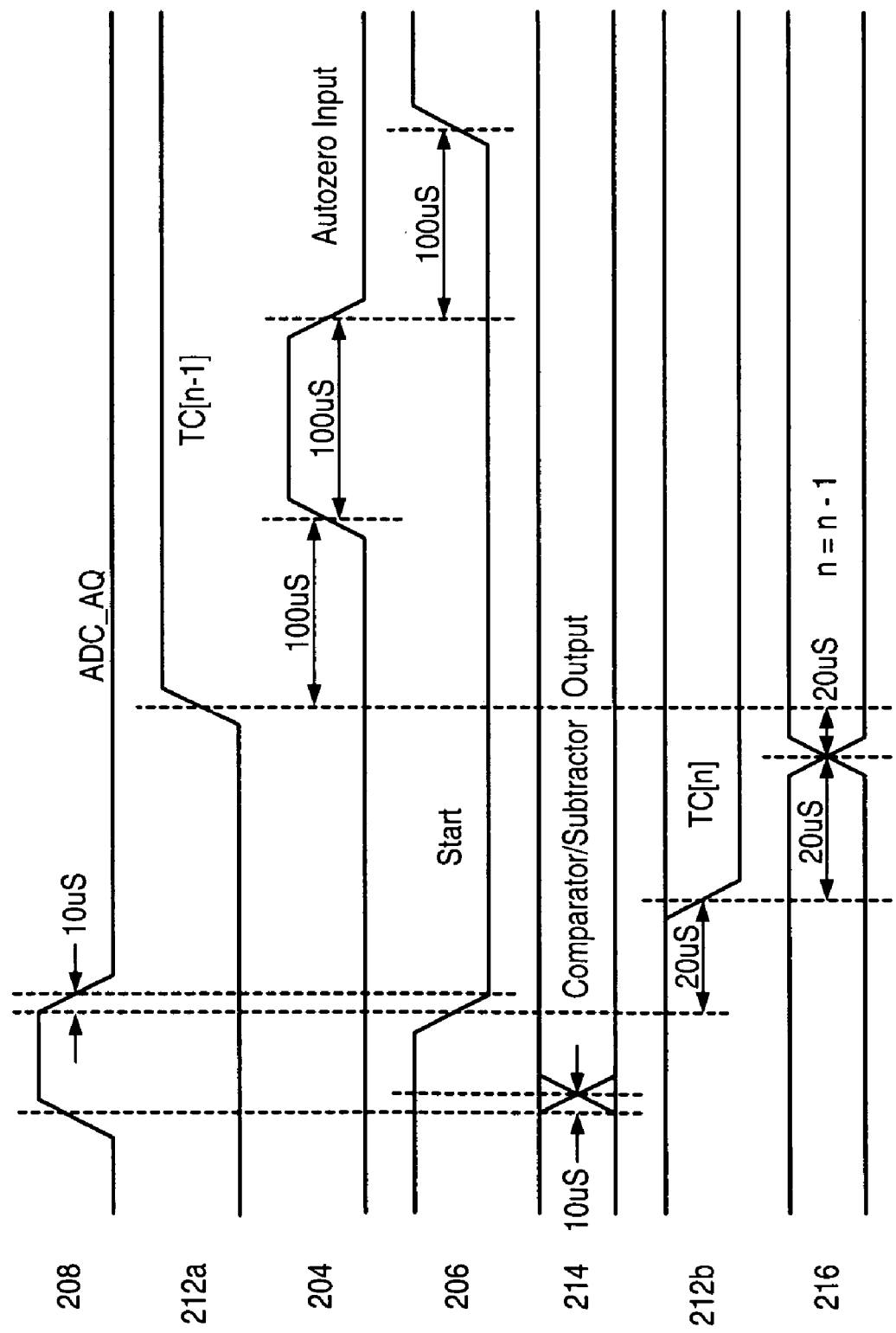
FIG. 6 shows a timing diagram illustrating the end of conversion timing, according to one embodiment.

FIG. 6 shows a timing diagram illustrating the end of conversion timing, again using the signals also shown in FIG. 3, which may be applicable to the embodiment shown in FIG. 2B. Once ADC_AQ 208 has been asserted, indicating the end of the current conversion performed by ADC 104, the control signal 212a for setting the current trim bit TC[n] may be deasserted. Subsequently, the trim bit index may be decreased by '1' as indicated by signal 216, and the control signal 212b for setting the next trim bit TC[n−1] may be asserted thereafter. Once the autozero input 204 for bandgap reference has been set, start signal 206 may again be asserted to initiate the next conversion. This timing may extend to performing conversions until the trimming is complete.

Figure 2C:
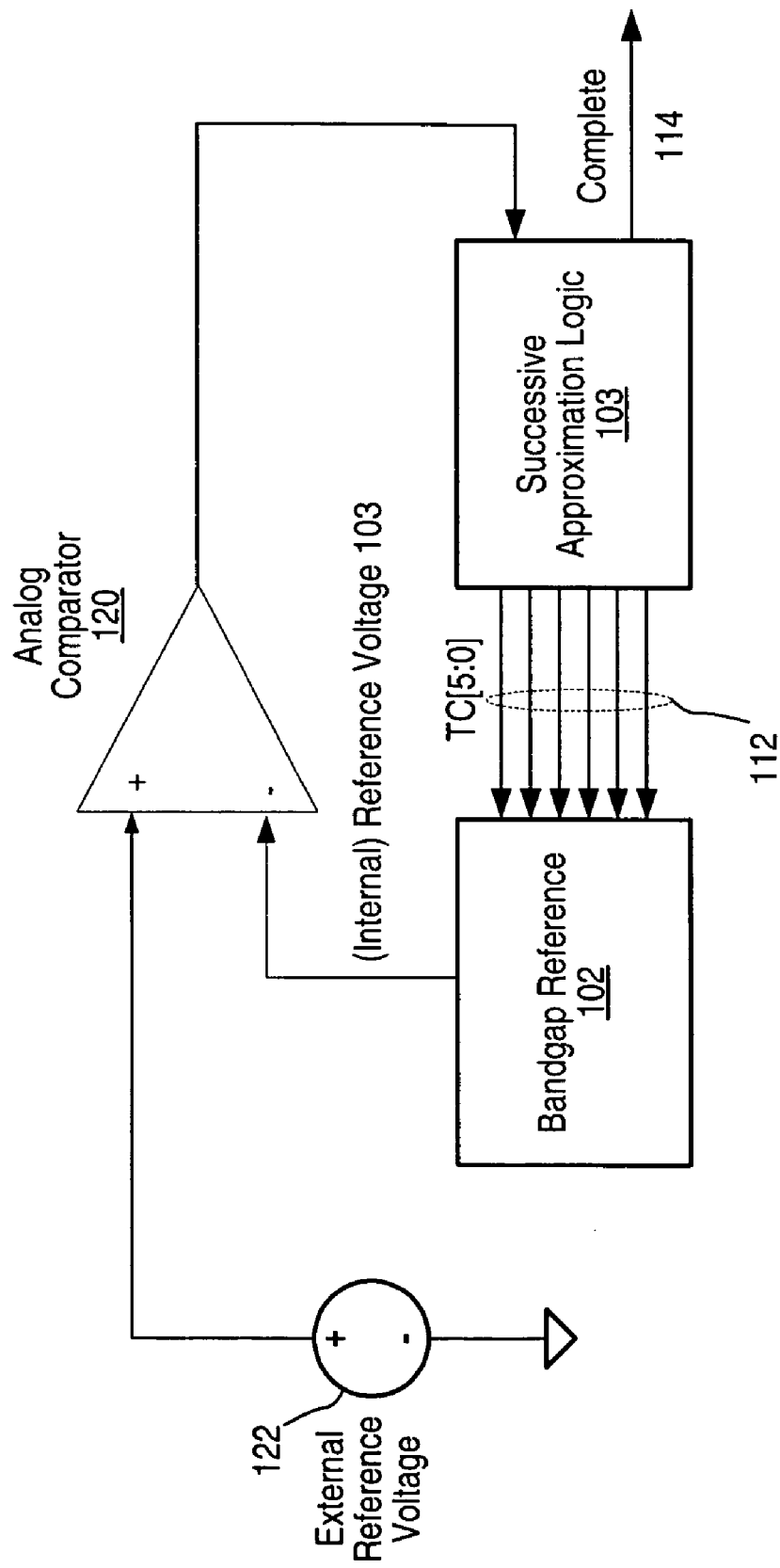
FIG. 2C illustrates in more detail a third embodiment of the integrated circuit of FIG. 1.

FIG. 2C shows one embodiment where an analog comparator 120 is used instead of an on-chip ADC (such as ADC 104, for example) to provide a digital representation of the reference voltage accuracy. Analog comparator 120 may be operated to directly compare internally generated reference voltage 103, which is to be trimmed, against an external reference voltage 122 that may be representative of the desired trimmed reference value generated by bandgap reference 102. The functionality and timing for the embodiment illustrated in FIG. 2C is identical to that of the embodiment shown in FIG. 2B. Thus, the embodiment of FIG. 2C may be configured with logic block 103 executing a successive approximation algorithm to compare one trim bit at a time. Analog comparator 120 may be configured on the same IC as SAL block 103 and bandgap reference 102, or it may be part of a system that is separate from the IC that contains SAL block 103 and bandgap reference 102.

In the Successive Approximation Method, comparison between the desired output (signal 118, referring to FIG. 2B) and the ADC output (signal 120, referring to FIG. 2B) may be a single bit (control signal 117, referring to FIG. 2B), indicating which digital value is greater. In the Remainder Method, the output of this comparison (control signal 116, referring to FIG. 2A) may be the actual multi-bit difference (remainder) between the two values (signals 118 and 120, referring to FIG. 2A). This difference value may be mapped to the trim bits (trim bits 112, referring to FIG. 2A) such that the trim bits are adjusted so as to make the difference between the desired output (signal 118) and the actual output (signal 120) of the ADC very close to zero. The mapping may be implemented via direct wiring of the remainder bits to the TC trim bits, a digital lookup table that relates the TC trim bits, or digital logic that functions to produce a truth table mapping between the TC trim bits and the remainder bits. Additional alternate mapping implementations are also possible and are contemplated.

When considering the two test algorithms described above, it should be noted that there exists a requirement inherent within the Successive Approximation Method to test the effect of the current trim bit settings on the actual ADC output value against the ideal value once for each bit, whereas after the first test at a mid scale (or nominal) setting, a satisfactory estimate may be made of what would constitute reasonable settings for the other trim bits. This estimate may be made by looking at the magnitude of the error in addition to the polarity of the error, whereas in a Successive Approximation Method only the polarity of the error may be considered for each bit.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. An integrated circuit comprising:
   a first component operable to generate a reference value; and
   a second component operable to execute a test algorithm configured to control a trimming of the first component according to an external control value to adjust the reference value; and
   an analog to digital converter (ADC), wherein the reference value is a reference voltage used by the ADC to determine a voltage range of an input signal converted by the ADC;
   wherein the second component is operable to begin executing the test algorithm in response to receiving a start signal from a tester apparatus configured to perform testing on the integrated circuit.

2. The integrated circuit of claim 1, wherein the ADC is comprised in a precision temperature sensor, and wherein in adjusting the reference value the second component operates to calibrate the precision temperature sensor.

3. The integrated circuit of claim 1, wherein the second component is operable to adjust the reference value according to a specified code corresponding to the external control value.

4. The integrated circuit of claim 1, wherein the first component is a bandgap reference and the reference value is a reference voltage.

5. The integrated circuit of claim 1, wherein the second component comprises mapping and control logic configured to perform the test algorithm.

6. The integrated circuit of claim 1;
   wherein the ADC is further configured to receive a specified input signal, and to generate an output code based on the specified input signal in accordance with the reference value.

7. The integrated circuit of claim 6 further comprising a fourth component configured to receive the output code and a specified code corresponding to the external control value, and to generate a control signal based on the output code and the specified code.

8. The integrated circuit of claim 7, wherein the second component is configured to receive the control signal, and to adjust the reference value according to the control signal.

9. The integrated circuit of claim 8:
   wherein the first component is a bandgap reference;
   wherein the second component is a custom logic circuit; and
   wherein the fourth component is one of:
      a subtractor, wherein the control signal represents a difference between the output code and the specified code; and
      a comparator, wherein the control signal indicates whether the output code is less than or equal to the specified code.

10. The integrated circuit of claim 9;
   wherein the reference value is a reference voltage;
   wherein the specified input signal is a known voltage;
   wherein the external control value represents a desired reference voltage;
   wherein the output code is a numeric representation of the known voltage in accordance with the reference voltage; and
   wherein the specified code is a numeric representation of the known voltage in accordance with the desired reference voltage.

11. The integrated circuit of claim 9, wherein the ADC is comprised in a temperature measurement system configured on the integrated circuit, wherein in adjusting the reference value the custom logic circuit operates to calibrate the temperature measurement system.

12. The integrated circuit of claim 9;
   wherein if the fourth component is a subtractor then the trimming is completed when the difference between the output code and the specified code has reached a specified value.

13. The integrated circuit of claim 9;
   wherein if the fourth component is a comparator then the trimming is completed when the output code and the specified code have the same value.

14. The integrated circuit of claim 1, wherein the test algorithm implements a Remainder Method, wherein control of the trimming is performed based on a magnitude of a remainder from a subtraction of two digital values;
wherein a first of the digital values is a result of a temperature conversion and the second of the digital values is a target value for the temperature conversion.

15. The integrated circuit of claim 1, wherein the test algorithm implements a Successive Approximation Method.

16. The integrated circuit of claim 1, wherein the tester apparatus is configured to poll the second component to determine whether the trimming has been completed.

17. The integrated circuit of claim 1, wherein the second component is operable to provide a feedback signal to the tester apparatus indicating that the trimming has been completed.

18. The integrated circuit of claim 17, wherein the trimming is performed within a specified amount of time.

19. A method comprising:
generating a reference value, wherein said generating is performed by a first component configured on an integrated circuit;
receiving an external control value;
executing a test algorithm using the external control value, wherein said executing is performed by a second component configured on the integrated circuit; and
trimming the first component according to the test algorithm, thereby adjusting the reference value to substantially match the external control value;
wherein said executing is operable to begin in response to receiving a start signal from a tester apparatus configured to perform testing on the integrated circuit; and
wherein said executing comprises controlling the trimming based on a magnitude of a remainder from a subtraction of two digital values, wherein a first of the digital values is a result of a temperature conversion performed using the reference value, and the second of the digital values is a target value for the temperature conversion.

20. The method of claim 19, further comprising providing the reference value to a third component configured on the integrated circuit, wherein the third component is configured to operate in accordance with the reference value, and is operable to perform a specified function of the integrated circuit.

21. The method of claim 19, wherein the first component is a bandgap reference and the reference value is a reference voltage.

22. The method of claim 19, wherein said executing comprises controlling the trimming based on multiple temperature conversions, according to a Successive Approximation Method.

23. The method of claim 19, wherein said executing comprises controlling one or more trim control bits, wherein the one or more trim control bits are configured to determine the scope and size of said trimming.

24. The method of claim 23, further comprising generating a model signal based on the external control value.

25. The method of claim 24, wherein said controlling comprises setting the one or more trim control bits to a nominal value upon starting said executing.

26. The method of claim 25, wherein said controlling further comprises:
generating an output signal based on the reference value;
comparing the output signal and the model signal, thereby obtaining a difference output; and
adjusting the trim control bits according to the difference output.

27. The method of claim 26, wherein said generating, said comparing, and said adjusting are performed a plurality of times until said adjusting has been performed a specified number of times.

28. The method of claim 26, wherein said generating, said comparing, and said adjusting are performed a plurality of times until the difference output has reached a specified value.

29. The method of claim 24, wherein said controlling comprises setting an index to an initial value, wherein for each value of the index, the index identifies a respective one of the trim control bits.

30. The method of claim 29, wherein said controlling further comprises performing a control sequence;
wherein the control sequence comprises:
setting the respective one of the trim control bits identified by the index;
generating an output signal based on the reference value;
comparing the output signal and the model signal, thereby determining if the output signal is less than or equal to the model signal;
if the output signal is less than the model signal, decreasing a present value of the index by 1; and
if the output signal is greater than the model signal, decreasing a present value of the index by 1 and resetting the respective one of the trim control bits identified by the index.

31. The method of claim 30, wherein the control sequence is performed a plurality of times until the output signal is equal to the model signal.

32. The method of claim 30, wherein the control sequence is performed a plurality of times until the present value of the index is 0.

33. The method of claim 19, wherein said trimming comprises cutting fuses and leaving fuses uncut.

34. The method of claim 19, wherein said trimming comprises programming a memory element.

35. The method of claim 34, wherein the memory element is a one time programmable memory element.

36. A system comprising:
an integrated circuit, wherein the integrated circuit comprises:
a bandgap reference operable to generate a reference voltage;
an ADC configured to use the reference voltage to determine a voltage range of an input signal converted by the ADC; and
a control logic circuit operable to execute a test algorithm configured to control a trimming of the bandgap reference to adjust the reference voltage according to an external control value and an output value generated from a specified input signal by the ADC; and
a tester coupled to the integrated circuit and configured to perform testing on the integrated circuit;
wherein the control logic circuit is operable to begin executing the test algorithm in response to receiving a start signal from the tester.

37. The system of claim 36, wherein the integrated circuit further comprises a temperature measurement system, wherein the ADC is configured in the temperature measurement system, and wherein in adjusting the reference voltage, the control logic circuit operates to calibrate the temperature measurement system.

38. An integrated circuit comprising:

a first component operable to generate a reference value; and a second component operable to execute a test algorithm configured to control a trimming of the first component according to an external control value to adjust the reference value;

wherein the second component is operable to begin executing the test algorithm in response to receiving a start signal from a tester apparatus configured to perform testing on the integrated circuit;

wherein the test algorithm implements a Remainder Method, wherein control of the trimming is performed based on a magnitude of a remainder from a subtraction of two digital values; and wherein a first of the digital values is a result of a temperature conversion performed using the reference value, and the second of the digital values is a target value for the temperature conversion.

* * * * *